United States Patent
Jeon et al.

(10) Patent No.: US 7,656,714 B2
(45) Date of Patent: Feb. 2, 2010

(54) BITLINE BIAS CIRCUIT AND NOR FLASH MEMORY DEVICE INCLUDING THE BITLINE BIAS CIRCUIT

(75) Inventors: Hong-Soo Jeon, Suwon-si (KR); Seung-Keun Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 150 days.

(21) Appl. No.: 11/265,218

(22) Filed: Nov. 2, 2005

(65) Prior Publication Data

US 2006/0092707 A1    May 4, 2006

(30) Foreign Application Priority Data

Nov. 3, 2004   (KR) .................. 10-2004-0088983
Nov. 3, 2004   (KR) .................. 10-2004-0088984

(51) Int. Cl.
  *G11C 16/06* (2006.01)
(52) U.S. Cl. .................. 365/185.23; 365/185.18; 365/185.2; 365/185.21
(58) Field of Classification Search ............ 365/189.09, 365/189.11, 18.185, 185.18, 185.2, 185.23, 365/185.21
See application file for complete search history.

(56) References Cited

U.S. PATENT DOCUMENTS

| | | | |
|---|---|---|---|
| 6,049,491 A | 4/2000 | La Rosa | 365/189.09 |
| 6,097,635 A | 8/2000 | Chang | 365/185.21 |
| 6,292,406 B1* | 9/2001 | Le et al. | 365/189.09 |
| 6,385,086 B1* | 5/2002 | Mihara et al. | 365/185.11 |
| 6,424,578 B2 | 7/2002 | Sim et al. | 365/189.09 |
| 6,754,107 B2* | 6/2004 | Khouri et al. | 365/185.23 |
| 6,879,521 B2* | 4/2005 | Furuyama | 365/185.24 |
| 7,050,328 B2* | 5/2006 | Khouri et al. | 365/163 |
| 7,149,132 B2* | 12/2006 | Bedeschi et al. | 365/189.11 |
| 2003/0174539 A1* | 9/2003 | Byeon et al. | 365/185.21 |

FOREIGN PATENT DOCUMENTS

| | | |
|---|---|---|
| JP | 10-188585 | 7/1998 |
| KR | 2001-0092074 | 10/2001 |
| KR | 2003-162897 | 6/2003 |
| KR | 2003-0072434 | 9/2003 |

* cited by examiner

*Primary Examiner*—Amir Zarabian
*Assistant Examiner*—Kretelia Graham
(74) *Attorney, Agent, or Firm*—Mills & Onello, LLP

(57) ABSTRACT

The NOR flash memory device according to the present invention is operated by a high voltage supplied from bitline selection transistors and includes a bitline bias circuit for supplying a bias voltage of a constant level to the bitline bias transistor. In accordance with the present invention, it is possible to stably supply a desired voltage closing to a power voltage to the bitline bias transistor.

8 Claims, 6 Drawing Sheets

BITLINE BIAS CIRCUIT AND NOR FLASH MEMORY DEVICE INCLUDING THE BITLINE BIAS CIRCUIT

CROSS-REFERENCE TO RELATED APPLICATIONS

This U.S. non-provisional patent application claims priority under 35 U.S.C. § 119 of Korean Patent Application Nos. 2004-88984 and 2004-88983 filed on Nov. 3, 2004, the entire contents of which are hereby incorporated by reference.

BACKGROUND OF THE INVENTION

The invention is concerned with a flash memory device. In particular, the present invention relates to a bitline bias circuit and a NOR flash device including the bitline bias circuit.

Flash memories are basically one type of non-volatile memory, in which data is safely maintained even if its power supply is cut off. Flash memories are used in mobile applications such as digital cameras, cellular phones, PDAs and so forth. This is because the flash memories have low power consumption and free input/output of information. There exist two major types of cell arrays in flash memories: NOR and NAND type cell arrays. A more compact size of memory can be realized by the NAND-type flash memory device because of its essentially contactless structure. In addition, the NAND array can be manufactured at low cost as compared with a NOR flash memory device. The NAND-type flash memory device is the kind of data storage memory device used in USB storage devices, MP3 players, and so on. In contrast, since the NOR flash memory device has a competitive speed for data accessing and is commonly used in "Code Flash", it is adopted in the application of cellular phone terminals.

The NOR flash memory device includes a bitline bias circuit. The bitline bias circuit performs a function to stably supply a predetermined voltage (e.g., about 1 V) to a drain of a memory cell during a read operation. A bias voltage outputted from the bitline bias circuit is provided to a gate of a bitline bias transistor. The bitline bias transistor is connected between bitline selection transistors and a sense amplifier.

In the NOR flash memory device, a voltage higher than a power voltage is applied to a gate of the bitline selection transistors. Accordingly, the bitline selection transistors are constituted by high voltage NMOS transistors having durability with respect to a high voltage. The high voltage NMOS transistors are connected serially. Also, a constant voltage below a power voltage supplied from the bitline bias circuit is applied to a gate of the bitline bias transistor. Thus, the bitline bias transistor is constituted by a conventional low voltage NMOS transistor.

The bitline bias circuit may supply a voltage close to a power voltage to the bitline bias transistor. However, it is difficult to stably supply a voltage close to the power voltage to the bitline bias transistor due to characteristics of transistors. Also, in the event that a power voltage applied to the bitline bias circuit is decreased, there is a problem that a bias voltage applied to the bitline bias transistor is also decreased.

Additionally, a conventional bitline bias circuit always should provide a bias voltage having a constant level. Since a conventional bitline bias circuit is always operated, there is a problem of large power consumption due to leakage current.

SUMMARY OF THE INVENTION

The invention provides a NOR flash memory device capable of stably supplying a desired bias voltage to a bitline bias transistor using a high voltage supplied to a bitline selection transistor, as well as reducing power consumption.

The invention also provides a bitline bias circuit for stably supplying a desired bias voltage near a power voltage to a bitline bias transistor using a high voltage supplied to a bitline selection transistor.

In one aspect, the invention is directed to a NOR flash memory device comprising a memory cell; bitline selection transistors connected to the memory cell; a high voltage generating circuit for supplying a higher voltage than a power voltage to the bitline selection transistors; a bitline bias transistor connected to the bitline selection transistors; a bitline bias circuit receiving a high voltage supplied from the high voltage generating circuit and supplying a bias voltage to the bitline bias transistor; and a sense amplifier connected to the bitline bias transistor and sensing and amplifying a current of a bitline.

In one embodiment, the high voltage supplied to the bitline selection transistor is provided during a reading operation.

In one embodiment, the bitline bias circuit includes high voltage transistors for having an endurance with respect to the high voltage supplied from the high voltage generating circuit.

In some embodiments of the invention, the bitline bias circuit includes: a voltage division circuit for dividing the bias voltage to generate a division voltage; a comparator driven by the high voltage supplied from the high voltage generating circuit and generating a driving voltage when the division voltage is lower than a predetermined reference voltage; and a driver for providing the high voltage supplied from the high voltage generating circuit as the bias voltage in response to the driving voltage.

In one embodiment, the voltage divider circuit includes two resistors that are serially connected and divides the bias voltage according to a rate of a resistance value.

In one embodiment, the comparator is a differential amplifier formed by high voltage transistors having a durability to the high voltage supplied from the high voltage generating circuit.

In one embodiment, the driver is a high voltage PMOS transistor having a source receiving the high voltage provided from the high voltage generating circuit, a drain providing the bias voltage, and a gate receiving the driving voltage.

In another aspect, the invention is directed to a bitline bias circuit used in a NOR flash memory device, the bitline bias circuit including: a voltage divider circuit dividing a bias voltage and generating a divided voltage; a comparator driven by a higher voltage than a power voltage and generating a driving voltage when the divided voltage is lower than a predetermined reference voltage; and a driver providing the high voltage to the bias voltage in response to the driving voltage.

In one embodiment, the high voltage is a voltage supplied to bitline selection transistors. In one embodiment, the high voltage is a voltage supplied to the bitline selection transistors during a read operation.

In one embodiment, the voltage dividing circuit includes two resistors that are serially connected and divides the bias voltage at a rate of a resistance value.

In one embodiment, the comparator is a differential amplifier constituted by high voltage transistors having a durability with respect to the high voltage.

In one embodiment, the driver is a high voltage PMOS transistor including a source receiving the high voltage, a drain for supplying the bias voltage, and a gate receiving the driving voltage.

In another aspect, the invention is directed to a NOR flash memory device comprising: a memory cell; a bitline selection transistor connected to the memory cell; a high voltage generating circuit providing a higher voltage than a power voltage to the bitline selection transistors; a pulse generating circuit generating a pump enable signal when the high voltage becomes lower than a predetermined voltage; a bitline bias transistor connected to the bitline selection transistors; a bitline bias circuit operated in response to the pump enable signal, and receiving the high voltage to provide a bias voltage to the bitline bias transistor; and a sense amplifier connected to the bitline bias transistor, and sensing and amplifying a current of the memory cell.

In one embodiment, the high voltage provided to the bitline selection transistors is provided during a read operation.

In one embodiment, the bitline bias circuit includes high voltage transistors having a durability with respect to the high voltage provided from the high voltage generating circuit.

In one embodiment, the bitline bias circuit includes: a voltage divider circuit dividing the bias voltage in response to the pump enable signal and generating a divided voltage; a comparator operated in response to the pump enable signal, receiving a high voltage provided from the high voltage generating circuit, and generating a drive voltage when the divided voltage is lower than a predetermined reference voltage; and a driver providing the high voltage generated from the high voltage generating circuit to the bias voltage in response to the drive voltage.

In one embodiment, the bitline bias circuit further includes a control means breaking an operation of the driver when the pump enable signal is in a low level state. In one embodiment, the control means includes a level shifter receiving the high voltage provided from the high voltage generating circuit.

In one embodiment, the voltage divider circuit includes: first and second resistors serially connected with each other and dividing the bias voltage according to a rate of a resistance value; and an NMOS transistor connected between the second resistor and a ground, and the NMOS transistor turned on or off in response to the pump enable signal.

In one embodiment, the comparator is a differential amplifier comprised of high voltage transistors having a durability with respect to the high voltage provided from the high voltage generating circuit.

In one embodiment, the driver a high voltage PMOS transistor including a source receiving the high voltage provided from the high voltage generating circuit, a drain providing the bias voltage, and a gate receiving the drive voltage.

According to another aspect, the invention is directed to a bitline bias circuit providing a bias voltage to a bitline bias transistor, the bitline bias circuit comprising: a voltage divider circuit dividing the bias voltage to a pump enable signal and generating a divided voltage; a comparator operated in response to the pump enable signal, receiving a higher voltage than a power voltage, and generating a drive voltage when the divided voltage is lower than a reference voltage; and a driver providing the high voltage to the bias voltage in response to the drive voltage.

In one embodiment, the high voltage is a voltage provided to bitline selection transistors. In one embodiment, the pump enable signal is generated when the high voltage provided to the bitline selection transistors is lower than a predetermined voltage.

In one embodiment, the high voltage is a voltage provided to the bitline selection transistors during a read operation.

In one embodiment, the circuit further comprises a control means breaking an operation of the driver when the pump enable signal is in a low level. In one embodiment, the control means includes a level shifter receiving the high voltage.

In one embodiment, the voltage divider circuit includes: first and second resistors serially connected and dividing the bias voltage according to a rate of a resistance value; and an NMOS transistor connected between the second resistor and a ground, the NMOS transistor turned on or off in response to the pump enable signal.

In one embodiment, the comparator is a differential amplifier comprised of high voltage transistors having a durability with respect to the high voltage.

In one embodiment, the driver a high voltage PMOS transistor including a source receiving the high voltage provided from the high voltage generating circuit, a drain providing the bias voltage, and a gate receiving the drive voltage.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
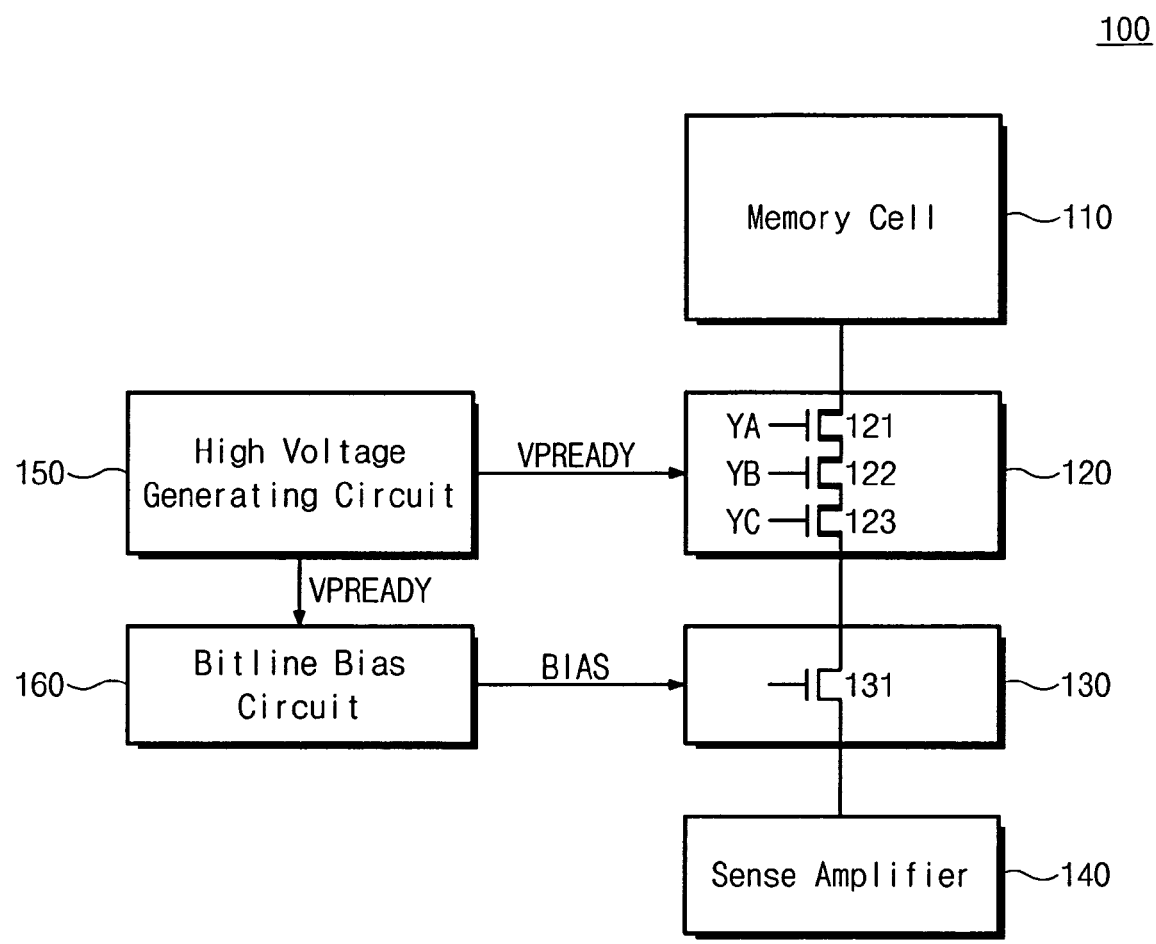
FIG. 1 is a block diagram showing a NOR flash memory device according to an embodiment of the present invention.

FIG. 1 is a block diagram showing a NOR flash memory device according to a preferred embodiment of the present invention. With reference to FIG. 1, the NOR flash memory device 100 includes a memory cell 110, bitline selection transistors 120, a bitline bias transistor 130, a sense amplifier 140, a high voltage generating circuit 150, and a bitline bias circuit 160.

The memory cell 110 is comprised of source/drain regions doped with N+ impurities that are formed on a P-type semiconductor substrate with a channel region interposed therebetween. Also, the memory cell has a floating gate and a control gate. The floating gate is formed on the channel region with thin insulating layer of 100 Å or less interposed therebetween, and the control gate is formed on the floating gate with an insulating layer interposed therebetween. The semiconductor substrate is respectively connected to power terminals for applying voltages that are required during a read, erase, and read operation.

During the read operation, a positive voltage (e.g., 1V) is applied to the drain, a predetermined voltage (e.g., 4.5V) is applied to the control gate, and 0V is applied to the source. If the read operation is performed under the above-mentioned condition, a programmed cell blocks a current path from the drain to the source, and an erased cell creates a current path.

At this time, the programmed cell is called "OFF cell", and the erased cell is called "ON cell".

The bitline selection transistors 120 include a plurality of transistors that are serially connected. The bitline selection transistors 120 are connected to the memory cell 110. The bitline selection transistors 120 include high voltage NMOS transistors 121, 122, and 123, which have a durability with a voltage higher than a power voltage.

The high voltage generating circuit 150 provides a higher voltage than a power voltage to a gate of the high voltage NMOS transistors 121, 122, and 123. For example, the high voltage generating circuit 150 provides a high voltage VPREADY during a read operation.

The bitline bias transistor 130 is connected to the bitline selection transistors 120. Also, the bitline bias transistor 130 includes one NMOS transistor 131.

The bitline bias circuit 160 receives a high voltage supplied from the high voltage generating circuit 150 and supplies a bias voltage BIAS to the bitline bias transistor 130. The bitline bias circuit 160 provides a constant voltage (e.g., about 1V) to a drain of the memory cell during a read operation. The construction and operation of the bitline bias circuit 160 will be more fully described referring to FIG. 2.

The sense amplifier 140 is connected to the bitline bias transistor 130, and senses and amplifies a current of a bitline.

Figure 2:
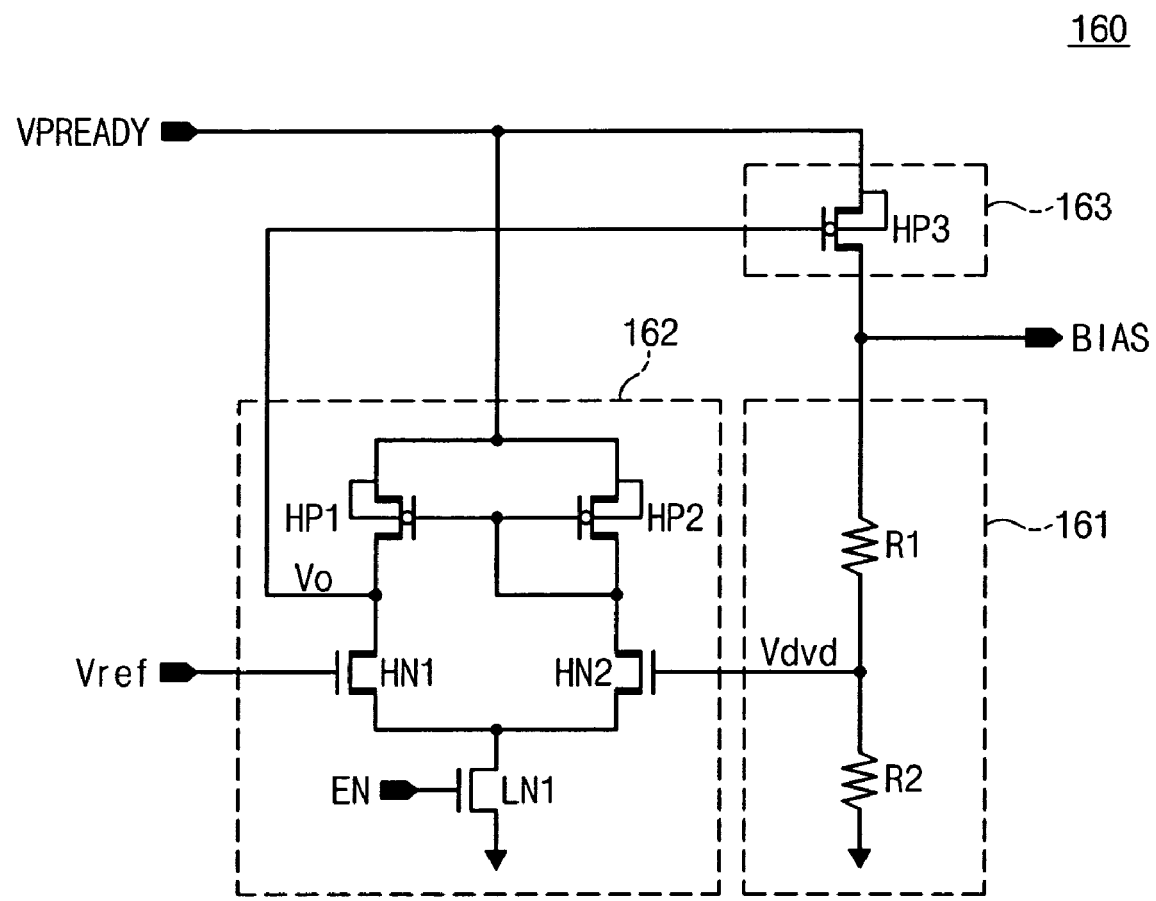
FIG. 2 is a circuit diagram showing a bitline bias circuit according to an embodiment of the present invention.

FIG. 2 is a circuit diagram showing a bitline bias circuit of FIG. 1. The bitline bias circuit 160 is used in a NOR flash memory device. With reference to FIG. 2, the bitline bias circuit 160 includes a voltage dividing circuit 161, a comparator 162, and a driver 163.

The voltage dividing circuit 161 includes two resistors R1 and R2, which are serially connected. The two resistors R1 and R2 divide a bias voltage BIAS supplied to the bitline bias transistor 130 (see FIG. 1) at a rate of a resistance value and then generates a divided voltage Vdvd.

The comparator 162 is driven by a voltage higher than a power voltage. For instance, the comparator 162 is driven by a high voltage VPREADY supplied from the high voltage generating circuit 150 shown in FIG. 1. The high voltage VPREADY is supplied to the bitline selection transistor (see FIG. 1) during a read operation. The comparator 162 compares a reference voltage Vref with the divided voltage Vdvd to generate a driving voltage when the divided voltage is lower than the reference voltage. In this case, the reference voltage is generated from a reference voltage generating circuit (not shown).

For example, the comparator 162 is a differential amplifier that is constituted with high voltage transistors having a durability with respect to a high voltage. With reference to FIG. 2 again, the differential amplifier 162 includes high voltage PMOS transistors HP1 and HP2, high voltage NMOS transistors HN1 and HN2, and a NMOS transistor LN1. An output voltage of the comparator 162, that is, a driving voltage Vo, is supplied to the driver 163.

The driver 163 supplies a high voltage from the high voltage generating circuit 150 to the bias voltage BIAS in response to the driving voltage Vo. For example, the driver 163 is a high voltage PMOS transistor HP3, which includes a source receiving the high voltage VPREADY supplied from the high voltage generating circuit 150 during a read operation, a drain supplying the bias voltage, and a gate receiving the driving voltage.

Referring still to FIG. 2, the bitline bias circuit 160 outputs a bias voltage BIAS with a constant level according to a resistance value of the voltage dividing circuit 161. If the bias voltage BIAS is lower than a desired voltage level, the driver 163 makes the bias voltage BIAS a desired level. On the contrary, if the bias voltage is higher than a desired voltage level, the operation of the driver 163 is blocked, so that the bias voltage becomes low. Through these processes, the bitline bias circuit 160 can stably supply a bias voltage of a desired level to the bitline bias circuit 130. Also, since the bitline bias circuit 160 is driven by a high voltage supplied to the bitline selection transistor 120, it may generate a voltage near a power voltage stably. Moreover, a problem such that a bias voltage is decreased by the decrement of a power voltage can be solved by the bitline bias circuit 160.

Figure 3:
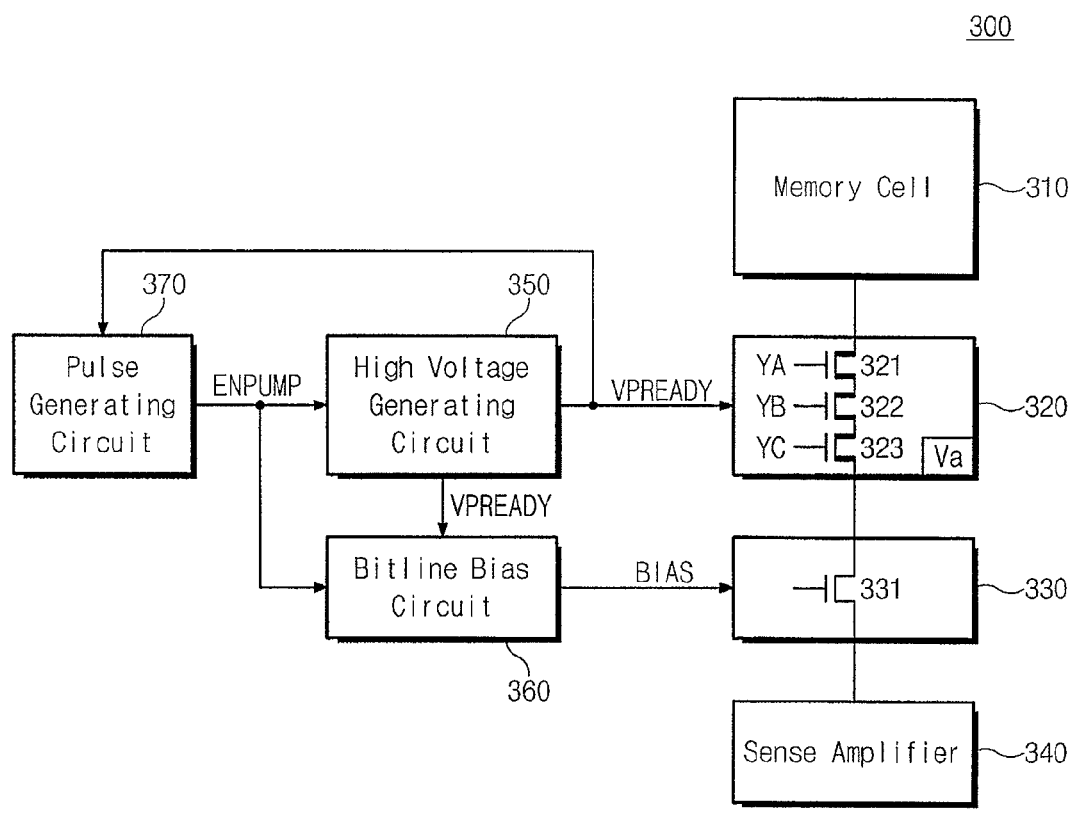
FIG. 3 is a block diagram showing a NOR flash memory device according to a second embodiment of the present invention.

FIG. 3 is a block diagram showing a NOR flash memory device according to a second embodiment of the present invention. Referring to FIG. 3, the NOR flash memory 300 comprises a memory cell 310, bitline selection transistors 320, a bitline bias transistor 330, a sense amplifier 340, a high voltage generating circuit 350, a bitline bias circuit 360, and a pulse generating circuit 370. Here, the memory cell 310, the bitline selection transistor 320, the bitline bias transistor 330, and the sense amplifier 340 are the same as those described in connection with FIG. 1.

The high voltage generating circuit 350 provides a higher voltage than a power voltage to a gate of NMOS transistors 321, 322, and 323. During a read operation, for instance, the high voltage generating circuit 350 provides a high voltage VPREADY. The high voltage generating circuit 350 is a charge pump generating a high voltage in response to a pulse enable signal ENPUMP provided from the pulse generating circuit 370.

The pulse generating circuit 370 generates a pulse signal every time a high voltage provided to the bitline selection transistors 320 is lower than a predetermined voltage Va.

In order to reduce current consumption, the bitline bias circuit 360 is operated in response to the pump enable signal ENPUMP. The bitline bias circuit 360 receives a high voltage provided from the high voltage generating circuit 350 and provides a bias voltage BIAS to the bitline bias transistor 330. The bitline bias circuit 360 provides constant voltage (e.g., about 1V) to a drain of the memory cell 310 during a read operation. The construction and operation of the bitline bias circuit 360 will be more fully described with reference to FIG. 4.

Figure 4:
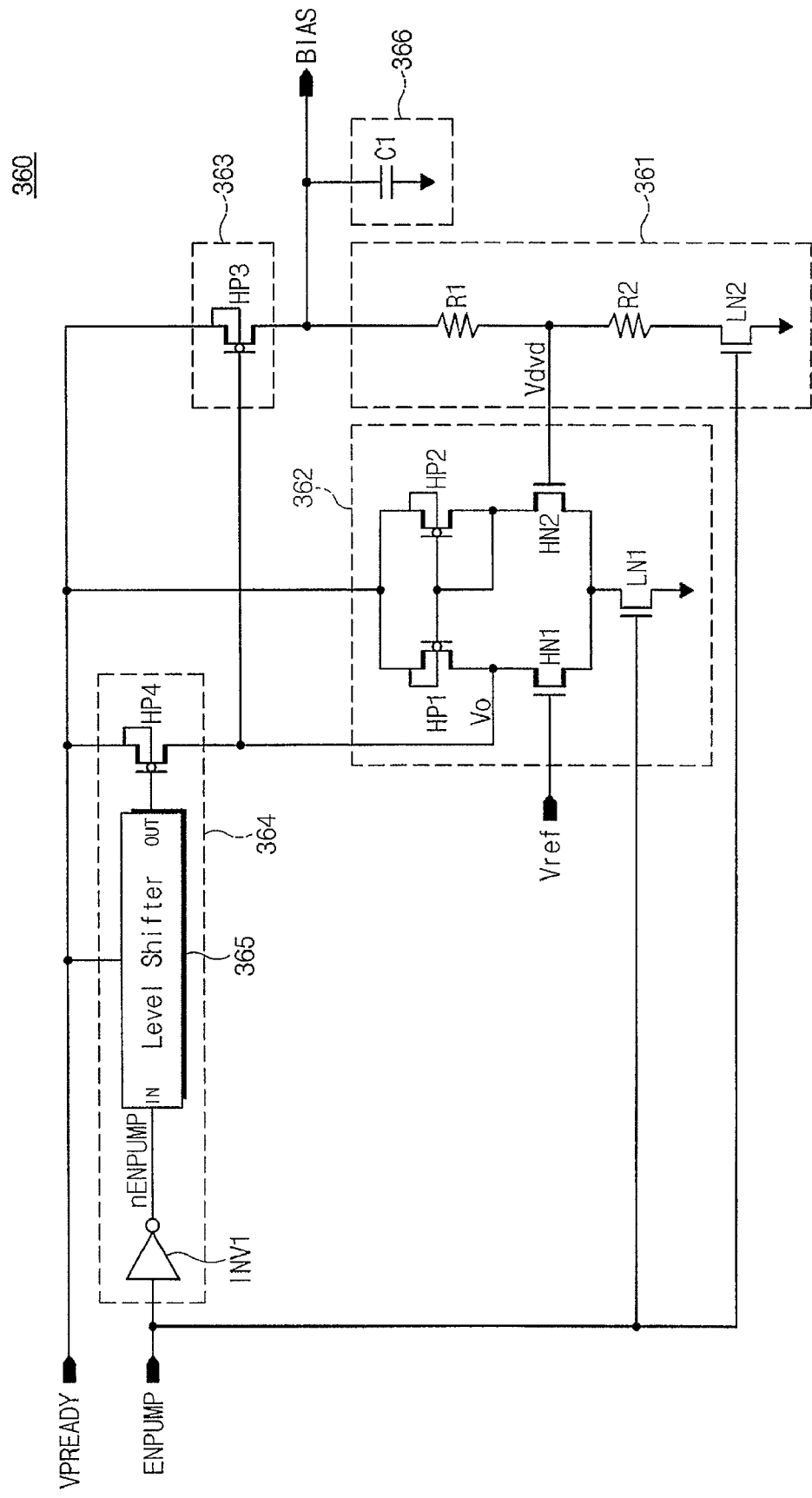
FIG. 4 is a circuit diagram showing a bitline bias circuit of FIG. 3.

FIG. 4 is a circuit diagram showing a bitline bias circuit of FIG. 3. The bitline bias circuit 360 is adopted in a NOR flash memory device and provides a bias voltage to a bitline bias transistor. The bitline bias circuit 360 is operated in response to a pump enable signal ENPUMP, thereby reducing current consumption.

Referring to FIG. 4, the bitline bias circuit 360 includes a voltage divider circuit 361, a comparator 362, a control means 364, and a capacitor 366.

The voltage divider circuit 361 includes a first resistor R1, a second resistor R2, and an NMOS transistor LN2. The first and second resistors R1 and R2 are connected serially and divide a bias voltage BIAS according to a rate of a resistance value to generate a divided voltage Vdvd. The NMOS transistor LN2 is connected between the second resistor R2 and a ground, and is turned on or off in response to the pump enable signal ENPUMP. When the NMOS transistor is turned on or off, the operation of the voltage divider circuit 361 is broken. At this time, leakage current is prevented from flowing through the voltage divider circuit 361.

The comparator 362 is operated in response to the pump enable signal ENPUMP and driven by a higher voltage than a power voltage. For example, the comparator 362 is driven by a high voltage VPREADY provided from the high voltage generating circuit 350 of FIG. 3. The high voltage VPREADY is a voltage provided to the bitline selection transistor 320 (See FIG. 3) during a read operation.

The comparator 362 compares a reference voltage Vref with a divided voltage Vdvd. Then, in the event that the divided voltage is lower than the reference voltage, the comparator 362 generates an output voltage Vo, that is, a driving voltage. Here, the reference voltage is generated from a reference voltage generator (not shown). The driving voltage Vo outputted from the comparator 362 is provided to the driver 363.

For example, the comparator 362 is a differential amplifier comprised of high voltage transistors having a durability with respect to a high voltage. The differential amplifier includes high voltage PMOS transistors HP1 and HP2, high voltage NMOS transistors HN1 and HN2, and an NMOS transistor LN1. The NMOS transistor LN1 is turned on or off in response to the pump enable signal ENPUMP. When the NMOS transistor LN1 is turned off, the differential amplifier is not operated.

The driver 363 provides a high voltage supplied from the high voltage generating circuit 350 to bias voltage BIAS in response to the driving voltage BIAS. The driver 363 is a high voltage PMOS transistor HP3, which comprises a source receiving a high voltage VPREADY provided from the high voltage generating circuit 350, a drain providing the bias voltage, and a gate receiving the driving voltage during a read operation.

The control means 364 breaks an operation of the driver 363 when the pump enable signal ENPUMP is in a low level. The control means 364 includes an inverter INV1, a level shifter 365, and a high voltage PMOS transistor HP4. The inverter INV1 receives the pump enable signal ENPUMP. The level shifter 365 is driven by the high voltage VPREADY provided from the high voltage generating circuit 350. The level shifter 365 receives an output nENPUMP of the inverter INV1 and provides a voltage sufficient to turn on or off the high voltage PMOS transistor HP4. The construction and operation of the level shifter 365 will be described in detail with reference to FIG. 5. The source of the high voltage PMOS transistor HP4 receives the high voltage VPREADY. The gate is connected to an output terminal of the level shifter 365. The drain is connected to a gate of the driver 363.

The control means 364 prevents leakage current by breaking an operation of the driver 363 when the pump enable signal ENPUMP is in a low level. That is, when the pump enable signal ENPUMP is in a low level, the high voltage PMOS transistor HP4 is turned on. In this case, the high voltage VPREADY is applied to the gate of the driver 363 so that the operation is driver 363 is broken.

The bitline bias circuit 360 further includes a capacitor 366 so as to prevent the bias voltage BIAS from being varied greatly.

Referring to FIG. 4, the bitline bias circuit 360 outputs a bias voltage BIAS with constant voltage according to a resistance value of the voltage divider circuit 361 when the pump enable signal ENPUMP is in a low level. If the bias voltage BIAS is lower than a desired voltage level, the comparator 362 operates the driver 363. The driver 363 raises the bias voltage BIAS to a desired level. In contrast, if the bias voltage BIAS is higher than a desired voltage level, the comparator 362 drops the bias voltage BIAS by breaking the operation of the driver 363. By performing these processes, the bitline bias circuit 360 can stably provide a bias voltage BIAS with a desired level to the bitline bias transistor 330.

The bitline bias circuit 360 prevents leakage current by breaking operations of the voltage divider circuit 361, the comparator 362, and the comparator 363 when the pump enable signal ENPUMP is in a low level.

Figure 5:
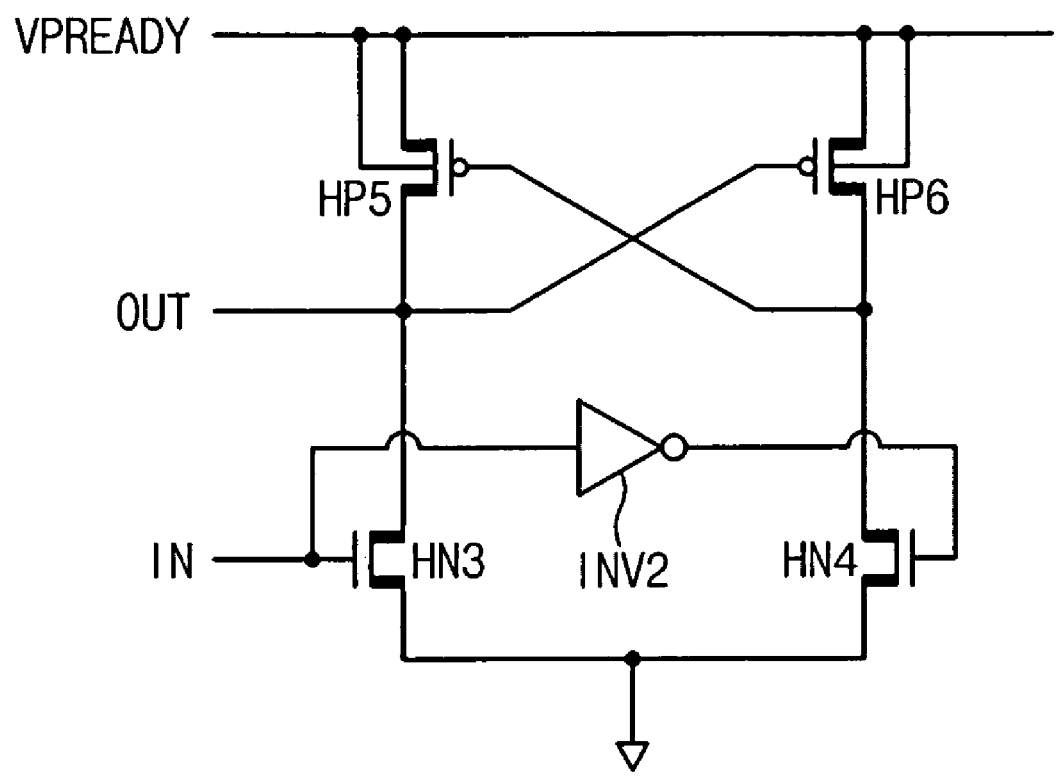
FIG. 5 is a circuit diagram showing a level shifter of FIG. 4.

FIG. 5 is a circuit diagram showing the level shifter of FIG. 4. Referring to FIG. 5, the level shifter 365 includes an inverter INV2, high voltage transistors HN3 and HN4, and high voltage PMOS transistors HP5 and HP6.

When an input signal of high level is applied, the high voltage NMOS transistor HN3 and a high voltage PMOS transistor HP6 are turned on. At this time, the high voltage PMOS transistor HP5 is turned on, thereby generating an output signal of low level. In contrast, when an input signal of low level is applied, a high voltage NMOS transistor HN4 and a high voltage PMOS transistor HP5 are turned on. At this time, the high voltage PMOS transistor HP5 is turned oh, thereby generating an output signal of high level.

Figure 6:
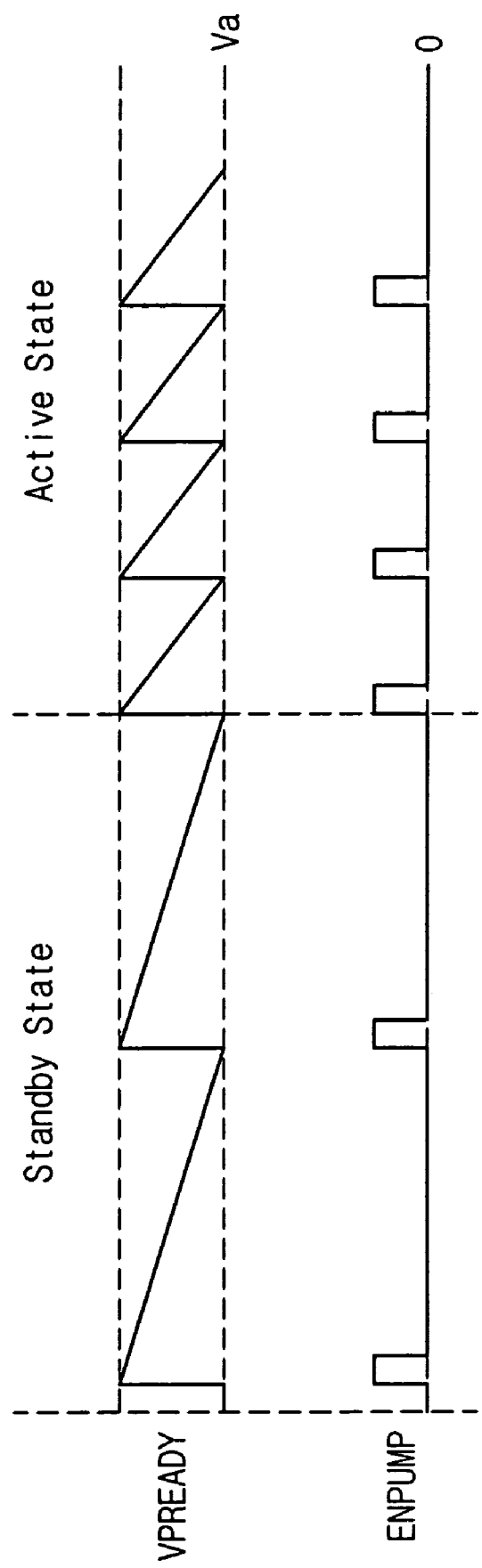
FIG. 6 is a wave form chart of a pump enable signal when a system is in a standby state or an active state.

FIG. 6 is a waveform chart of a pump enable signal when a system is in a standby state or an active state, according to the invention. Referring to FIG. 6, when the high voltage VPREADY provided to the bitline selection transistor 320 (See FIG. 3) becomes lower than a predetermined voltage Va, the pump enable signal ENPUMP is in a high level during a predetermined time.

As shown in FIG. 6, the pulse generating circuit 370 (See FIG. 3) generates more pulse signals in an active state rather than a standby state.

There are many problems such as large current consumption in a conventional bitline bias circuit because the pump enable signal ENPUMP is always in a high level. The bitline bias circuit according to the present invention is operated by a pump enable signal ENPUMP provided from the pulse generating circuit 370 so that it is possible to generate a bias voltage of constant level and to minimize current consumption.

As seen from the above, the NOR flash memory device according to the present invention is operated by a high voltage provided to a bitline selection transistor, with the result that a voltage near a power voltage can be generated stably. A problem that the more decreased a power voltage is, the more decreased a bias voltage is can be overcome.

As previously described, since the NOR flash memory device according to the present invention operates a bitline bias circuit using a high voltage applied to the bitline selection transistor, it is possible to stably provide a bias voltage of a constant level near a power voltage to the bitline selection transistor.

Additionally, the NOR flash memory device is operated in response to a pump enable signal, thereby reducing current consumption and generating a bias voltage of a constant level.

Furthermore, a bitline bias circuit is driven by a high voltage applied to a bitline selection transistor.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory device comprising:
    a memory cell;
    a plurality of serially connected bitline selection transistors connected to the memory cell via a bitline;
    a high voltage generating circuit configured to provide a high voltage that is higher than a power voltage to the bitline selection transistors;
    a bitline bias transistor connected between a sense amplifier and the bitline selection transistors;

a bitline bias circuit configured to receive the high voltage supplied from the high voltage generating circuit and to supply the high voltage supplied from the high voltage generating circuit as a bias voltage to the bitline bias transistor in parallel with the high voltage provided to the bitline selection transistors in response to a driving voltage, wherein the bitline bias circuit is also configured to maintain the bitline bias voltage at a substantially constant level during a read operation, wherein the sense amplifier connected to the bitline bias transistor is configured to sense and amplify a current of the bitline, wherein the driving voltage is generated when a division voltage is lower than a reference voltage, and wherein the division voltage is generated by dividing the bias voltage.

2. The memory device as set forth in claim 1, wherein the bitline bias circuit includes a driver configured to provide the high voltage supplied to the bitline selection transistor during the reading operation in response to the driving voltage.

3. The memory device as set forth in claim 1, wherein the bitline bias circuit includes high voltage transistors for having an endurance with respect to the high voltage supplied from the high voltage generating circuit.

4. A memory device comprising:

a memory cell;

a plurality of serially connected bitline selection transistors connected to the memory cell;

a high voltage generating circuit configured to provide a high voltage that is higher voltage than a power voltage to the bitline selection transistors;

a bitline bias transistor connected to the bitline selection transistors;

a bitline bias circuit configured to receive the high voltage supplied from the high voltage generating circuit and to supply the high voltage supplied from the high voltage generating circuit as a bias voltage to the bitline bias transistor in parallel with the high voltage provided to the bitline selection transistors, wherein the bitline bias circuit includes:

a voltage divider circuit configured to divide the bias voltage to generate a division voltage;

a comparator driven by the high voltage supplied from the high voltage generating circuit and configured to generate a driving voltage when the division voltage is lower than a reference voltage; and a driver configured to provide the high voltage supplied from the high voltage generating circuit as the bias voltage in response to the driving voltage, wherein the high voltage is maintained at a substantially constant level; and a sense amplifier connected to the bitline bias transistor and configured to sense and amplify a current of a bitline.

5. The memory device as set forth in claim 4, wherein the voltage divider circuit includes two resistors that are serially connected and divides the bias voltage according to a rate of a resistance value.

6. The memory device as set forth in claim 4, wherein the comparator is a differential amplifier formed by high voltage transistors having a durability to the high voltage supplied from the high voltage generating circuit.

7. The memory device as set forth in claim 4, wherein the driver is a high voltage PMOS transistor having a source receiving the high voltage provided from the high voltage generating circuit, a drain providing the bias voltage, and a gate receiving the driving voltage.

8. A memory device comprising:

a memory cell;

a plurality of serially connected bitline selection transistors connected to the memory cell via a bitline;

a high voltage generating circuit configured to provide a high voltage that is higher than a power voltage to the bitline selection transistors;

a bitline bias transistor connected between a sense amplifier and the bitline selection transistors; and a bitline bias circuit configured to receive the high voltage being supplied to the bitline selection transistors and to supply the high voltage as a bias voltage to the bitline bias transistor in parallel with the high voltage provided to the bitline selection transistors in response to a driving voltage, wherein the sense amplifier connected to the bitline bias transistor is configured to sense and amplify a current of the bitline, wherein the driving voltage is generated when a division voltage is lower than a reference voltage, and wherein the division voltage is generated by dividing the bias voltage.

\* \* \* \* \*